US012289084B2

(12) United States Patent
Yoshioka et al.

(10) Patent No.: US 12,289,084 B2
(45) Date of Patent: Apr. 29, 2025

(54) HIGH TOLERANCE VARIABLE GAIN AMPLIFIERS

(71) Applicant: TEXAS INSTRUMENTS INCORPORATED, Dallas, TX (US)

(72) Inventors: Masahiro Yoshioka, Allen, TX (US); Gabriel Hernandez De La Cruz, Richardson, TX (US); Lawrence Cotton, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 539 days.

(21) Appl. No.: 17/588,662

(22) Filed: Jan. 31, 2022

(65) Prior Publication Data

US 2023/0246612 A1 Aug. 3, 2023

(51) Int. Cl.
*H03F 3/45* (2006.01)
*H03F 1/30* (2006.01)

(52) U.S. Cl.
CPC ......... *H03F 3/45183* (2013.01); *H03F 1/301* (2013.01)

(58) Field of Classification Search
CPC ............ H03F 3/45183; H03F 1/301; H03F 2200/447; H03F 2200/468; H03F 2203/45528; H03F 3/45475
USPC ................... 330/252–261, 283, 289
See application file for complete search history.

(56) References Cited

U.S. PATENT DOCUMENTS

| 7,746,168 B2* | 6/2010 | Oishi | H03F 3/45183 330/252 |
| 11,652,458 B2* | 5/2023 | Ippolito | H03F 3/45744 330/253 |
| 2020/0292632 A1* | 9/2020 | Hikichi | G01R 33/075 |

* cited by examiner

*Primary Examiner* — Hieu P Nguyen
(74) *Attorney, Agent, or Firm* — John R. Pessetto; Frank D. Cimino

(57) ABSTRACT

Examples of amplifier circuitry regulate a transconductance value ($G_m$) of operational transconductance amplifiers (OTAs) in the amplifier to be approximately the same, which value is based on a supply voltage and a reference voltage applied to a reference OTA and the internal resistance of the reference OTA. The reference OTA generates an output current based on $G_m$ and the reference voltage, which current is compared to current generated by the supply voltage and internal resistance of the reference OTA. A tail current transistor of each of the reference OTA and a main OTA that mirrors the $G_m$ of the reference OTA provide a tail current feedback path by which $G_m$ is regulated. Amplifying circuitry is coupled to the main OTA to receive current signals. Based on the received current signals, amplifying circuitry generates a differential output voltage signal. The gain of the amplifying circuitry is proportional to the supply voltage and remains relatively constant across process temperature variations.

15 Claims, 3 Drawing Sheets

HIGH TOLERANCE VARIABLE GAIN AMPLIFIERS

FIELD OF DISCLOSURE

This disclosure relates generally to high tolerance variable gain amplifiers, and more particularly to ratiometric variable gain amplifiers with high process and temperature drift tolerance, as well as high tolerance to power supply variations.

BACKGROUND

Amplifiers, and in particular variable gain amplifiers, are used in many applications including sensing applications. For example, an amplifier may be coupled to the output of a sensor that measures an environmental condition or parameter, such as temperature, humidity, pressure, etc., and converts the measurement to an analog electrical signal, e.g., a voltage. That voltage output by the sensor is then amplified before being converted to a digital value by an analog-to-digital converter (ADC) coupled to the output of the amplifier. Typically, the relationship between the measured condition and the analog voltage indicative thereof is linear. In such a system in which a linear output voltage is input to an ADC, the output voltage should be proportional to the power supply of the system to generate a consistent digital output value for a given sensed input across power supply variations.

A previous approach uses a separate ADC to digitally control the gain of the amplifier through a switch and resistor network coupled between the output of the separate ADC and the output of the amplifier. However, in addition to adding an extra component and thus increasing the circuit footprint on a semiconductor substrate, this approach introduces an unwelcome quantization error.

In addition to being able to accommodate power supply variations, sensing/measurement systems should also be able to accommodate process temperature (PT) variations.

In this context, features and aspects of the present disclosure arise.

SUMMARY

In an example, an amplifier includes a first operational transconductance amplification (OTA) circuit including a reference signal input section configured to receive a reference voltage (e.g., $V_{ref}$) to generate an output current (e.g., $G_m*V_{ref}$) based on the reference voltage and a transconductance value ($G_m$) of the first OTA circuit. In a configuration, the first OTA circuit generates a comparison current (e.g., $V_{CC}/R_1$); in another configuration, the first OTA circuit generates a constant voltage. The amplifier also includes a second OTA circuit coupled to the first OTA circuit. The second OTA circuit includes an input signal input section configured to receive an input voltage (e.g., $V_{in}$) and an output at which an output signal is output. The second OTA circuit has substantially the same transconductance value ($G_m$) as the first OTA circuit. The amplifier also includes amplifying circuitry having an input coupled to the output of the second OTA circuit. The amplifying circuitry is configured to amplify the input voltage to generate and output an output signal (e.g., $V_{out}$).

In an example, an amplifier includes reference signal circuitry, input signal circuitry, and amplifying circuitry. The reference signal circuitry includes first and second reference signal transistors, each having first and second current terminals and a control terminal, which control terminals are configured to receive a differential reference voltage signal. The first current terminals of the first and second input transistors are coupled to define a first node. The reference signal circuitry also includes a first tail current transistor having current terminals respectively coupled to the first node and a ground terminal. The reference signal circuitry defines an output current path and a comparison current path. The input signal circuitry includes first and second input signal transistors each having first and second current terminals and a control terminal, which control terminals are configured to receive a differential input voltage signal. The first current terminals of the first and second input signal transistors are coupled to define a second node. The input signal circuitry also includes a second tail current transistor having current terminals respectively coupled to the second node and the ground terminal. The amplifying circuitry includes first and second current inputs respectively coupled to the second current terminals of the first and second input signal transistors, and first and second outputs at which a differential output voltage signal is output.

In an example, an amplifier comprises first and second operational transconductance amplification (OTA) circuits and amplifying circuitry. The first OTA circuit is configured to receive a reference voltage to generate an output current based on the reference voltage and a transconductance value of the first OTA circuit. The first OTA circuit is further configured to generate a comparison current and a first tail current. The second OTA circuit is coupled to the first OTA circuit and configured to receive an input voltage and to generate a second tail current; the second OTA circuit also has first and second current outputs. The amplifying circuitry has first and second current inputs that are respectively coupled to the first and second current outputs of the second OTA circuit; the amplifying circuitry also has first and second outputs at which a differential output voltage signal is output.

In an example, a method comprises applying a reference voltage to a first operational transconductance amplifier (OTA) circuit to generate an output current; comparing a current generated in the first OTA circuit from a voltage supply and an internal resistance of the first OTA circuit to the output current; obtaining a transfer gain value of the first OTA circuit and a second OTA circuit coupled to the first OTA circuit; generating tail currents through a first tail current element of the first OTA circuit and through a second tail current element in the second OTA circuit to regulate a transconductance value of the first and second OTA circuits, the second tail current element being coupled to the first tail current element to form a tail current feedback path; inputting an input voltage to the second OTA circuit; and generating an output voltage at an output of amplifying circuitry coupled to the second OTA circuit.

These and other features will be better understood from the following detailed description with reference to the accompanying drawings.

BRIEF DESCRIPTION OF THE DRAWINGS

Features of the disclosure may be understood from the following figures taken in conjunction with the detailed description.

DETAILED DESCRIPTION

Figure 1:
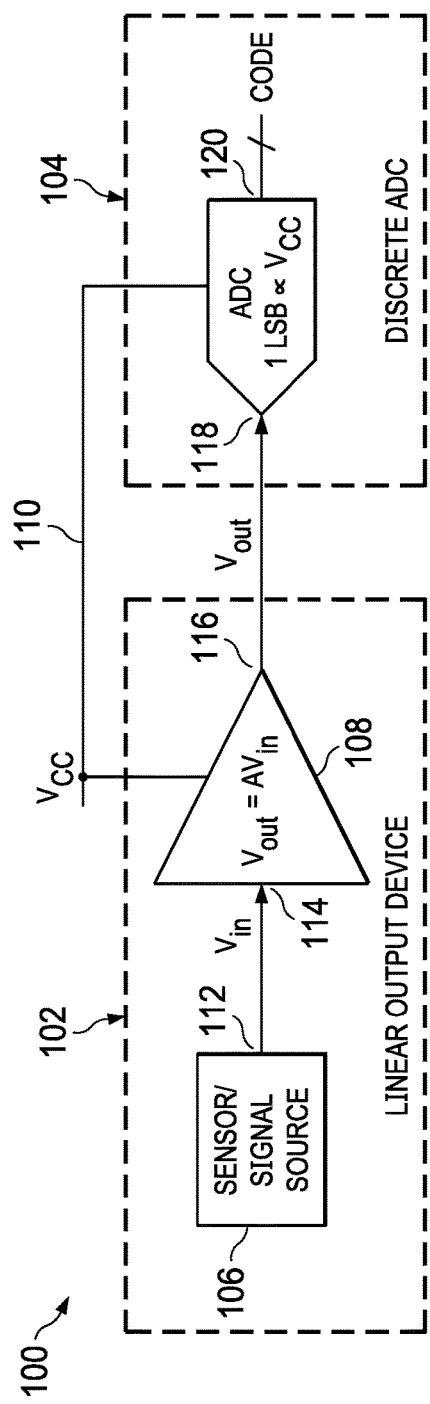
FIG. 1 is a diagram of an example sensing system.

Specific examples are described below in detail with reference to the accompanying figures. These examples are not intended to be limiting. In the drawings, corresponding numerals and symbols generally refer to corresponding parts unless otherwise indicated. The objects depicted in the drawings are not necessarily drawn to scale.

In example arrangements, systems, circuits and methods are provided that utilize a tail current feedback path to regulate transconductance of a ratiometric amplifier to minimize the variance of the gain of the amplifier across a range of process and temperature variations. In an example, the transconductance value is regulated by the supply voltage, a reference voltage, and internal resistance of a portion of the ratiometric amplifier. In an example, the gain is proportional to the supply voltage.

FIG. 1 is a diagram of an example sensing system 100 includes a linear output device 102 and a discrete analog-to-digital converter (ADC) 104 that includes ADC circuitry for digitizing an analog electrical signal. Linear output device 102 includes a sensor or signal source 106 and an amplifier 108. Both the ADC circuitry of ADC 104 and amplifier 108 are coupled to a supply terminal or rail 110 that supplies a voltage ($V_{CC}$). Sensor/signal source 106 may also be coupled to $V_{CC}$ or may be powered by another power supply.

Sensor/signal source 106 may be any of various sensors, such as a temperature sensor, humidity sensor, pressure sensor, magnetic sensor, etc., or other type of signal source, e.g., a converter. Sensor/signal source 106 may be configured to measure an environmental parameter and convert the measurement to an electrical signal, e.g., a voltage signal. Sensor/signal source 106 (simply sensor 106 hereafter) has an output 112 at which an analog electrical signal is output. In an example, the outputted analog electrical signal is a voltage signal ($V_{in}$).

Amplifier 108 has an input 114 coupled to output 112 of sensor 106 to receive the voltage signal ($V_{in}$), which may be a differential voltage signal. Amplifier 108 amplifies yin by an amplification factor (A) and generates an amplified voltage given by the expression $A*V_{in}$. Amplifier 108 has an output 116 at which it outputs the amplified voltage, which is denoted $V_{out}$. In a ratiometric system, $V_{out}$ has to be proportional to $V_{CC}$.

The ADC circuitry of discrete ADC 104 has an analog input 118 coupled to output 116 of amplifier 108 to receive $V_{out}$. The internal ADC circuitry samples the analog signal $V_{out}$ and converts each sample to a digital value. ADC has an output 120 at which the digital values, each of which may be represented as a code, is output. ADC 104 may be configured such that 1 least significant bit (LSB) is proportional to $V_{CC}$.

Figure 2:
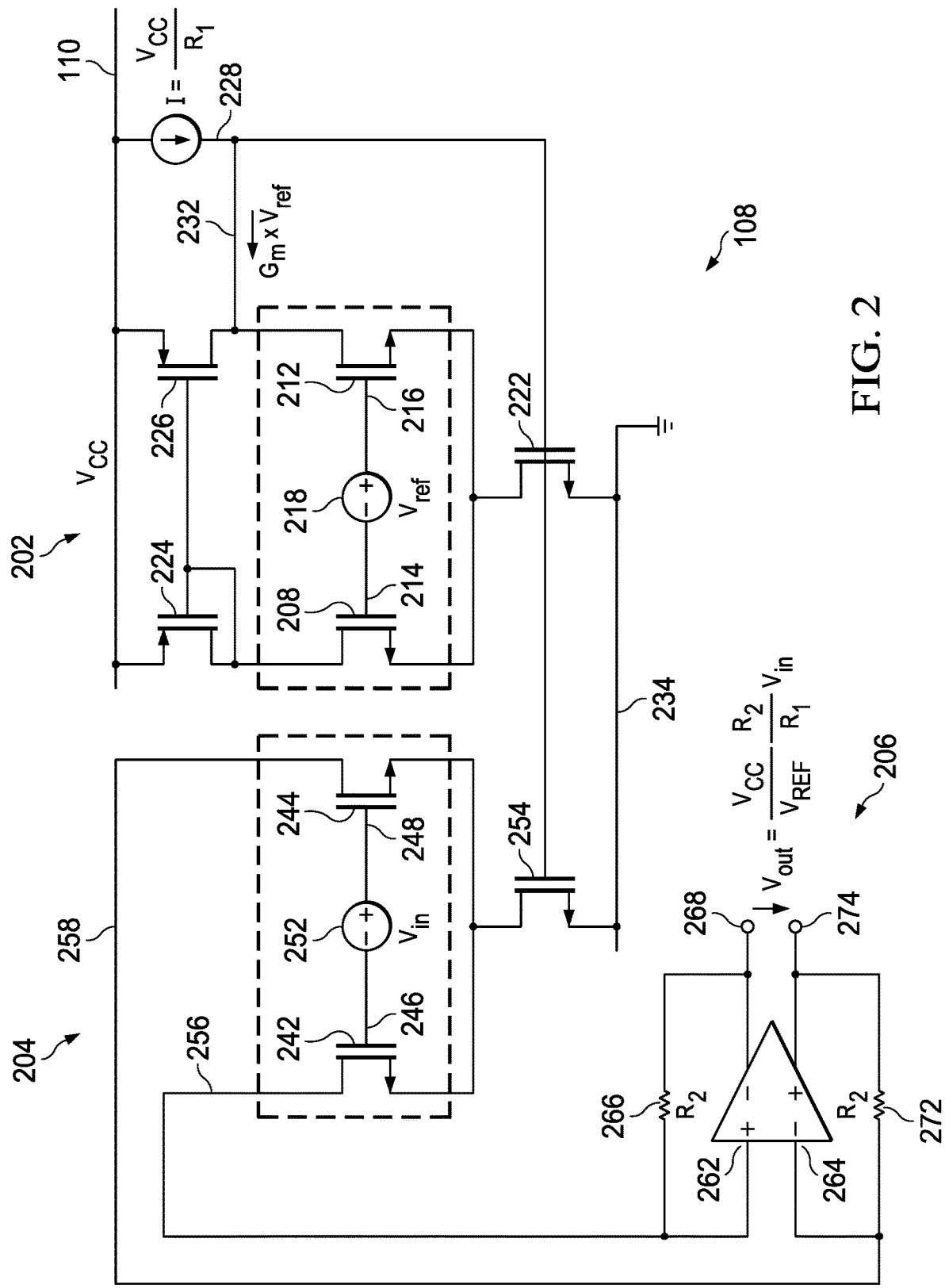
FIG. 2 is a circuit diagram of an example high tolerance ratiometric variable gain amplifier, which may be used in a sensing system.

To provide example amplifier 108 with high tolerance against power supply, e.g., $V_{CC}$, variation, as well as against process temperature (PT) variation, amplifier 108 may be configured as shown in FIG. 2. Example amplifier 108 of FIG. 2 includes a reference operational transconductance amplifier (OTA) circuit 202, a main OTA circuit 204, and amplifying circuitry 206. Reference OTA circuit 202 and main OTA circuit 204 may sometimes be referred to simply as reference OTA 202 and main OTA circuit 204.

Reference OTA 202 includes two input transistors 208 and 212 that form a reference signal input section as indicated by the dashed enclosure around these transistors. Each of transistors 208 and 212 may be an n-type metal-oxide-silicon field-effect transistor (n-MOSFET). Transistor 208 has a gate 214, and transistor 212 has a gate 216. Gates 214 and 216 are coupled to negative (−) and positive (+) terminals of a voltage source 218, which delivers a differential reference voltage signal ($V_{ref}$) to gates 214 and 216. The sources of transistors 208 and 212 are commonly coupled to a drain of an n-MOSFET transistor 222 through which a first tail current flows during operation. The source of transistor 222 is coupled to ground or negative supply terminal or rail 234.

Reference OTA 202 also includes a pair of transistors 224 and 226, each of which in an example, is a p-type metal-oxide-silicon FET (p-MOSFET). Transistors 224 and 226 are coupled in a current mirror configuration. The drains of transistors 224 and 226 are coupled to the drains of input transistors 208 and 212, respectively. The gates of transistors 224 and 226 are commonly coupled and also coupled to the drain-drain coupling of transistors 208 and 224. The sources of transistors 224 and 226 are coupled to supply terminal 110, which delivers supply voltage $V_{CC}$.

Reference OTA 202 has a first current path 228 in which a current (I) flows that is generated by $V_{CC}$ and the internal resistance ($R_1$) of reference OTA 202. That is, $I=V_{CC}/R_1$. An output current is generated and flows in a second current path 232 that extends from first current path 228 to the drain-drain coupling of transistors 212 and 226. The output current is approximately equal to $G_m*V_{ref}$, where $G_m$ is the transconductance of reference OTA 202.

Main OTA 204 of amplifier 108 has a pair of input transistors 242 and 244 that form an input signal input section as indicated by the dashed enclosure around these transistors. Each of transistors 242 and 244 may be an n-MOSFET. Gates 246 and 248 are respectively coupled to negative (−) and positive (+) terminals of a voltage source 252, which delivers a differential input voltage signal ($V_{in}$) to gates 246 and 248. The sources of transistors 242 and 244 are commonly coupled to a drain of n-MOSFET transistor 254 through which a second tail current flows during operation. The source of transistor 254 is coupled to ground 234. The drains of transistors 242 and 244 respectively form current outputs 256 and 258 of main OTA 204.

Reference OTA 202 and main OTA 204 are coupled via the gates of transistors 222 and 254 and through the sources of transistors 222 and 254. Thus, transistors 222 and 254 may function as a sink-source pair for the tail currents.

Amplifying circuitry 206 has two inputs 262 and 264, which are respectively coupled to the current outputs 256 and 258 of main OTA 204. One of the inputs of amplifying circuitry 206 is a positive (+) input and the other input is a negative (−) input. In an example, positive input 262 is coupled in an inverting feedback loop via a resistor 266 to a negative (−) output terminal 268 of amplifying circuitry 206, and negative (−) input 264 is coupled in an inverting feedback loop via resistor 272 to positive (+) output terminal 274 of amplifying circuitry 206. Each of resistors 266 and 272 is also identified as $R_2$, which indicates that each resistor has approximately the same resistance. $R_2$ may be any suitable resistance. A differential voltage ($V_{out}$) is output at outputs 268 and 274.

At reference OTA 202, a subtract current, which is the difference between I and the output current of OTA 202 (i.e., subtract current=$I-(G_m*V_{ref})$) flows into a gate of transistor 222 and into a gate of transistor 254, which controls tail currents of those transistors and a transconductance, $G_m$, of reference OTA 202 and main OTA 204. Thus, reference OTA 202 and a reference current source I generates a feedback system to adjust the transconductance of reference OTA 202. With this configuration of amplifier 108, first and second tail currents form a tail current feedback path by which the transconductance value ($G_m$) of reference OTA 202, and in particular of input transistors 208 and 212, is mirrored in main OTA 204, and in particular in input transistors 242 and 244, so both OTAs have the same $G_m$. By the tail current feedback path, which significantly reduces gain variation across a range of process temperature (PT) variations, $G_m$ is regulated to be approximately $(V_{CC}/V_{ref})/R_1$. In the example amplifier 108 shown in FIG. 2: $V_{out}=(V_{CC}/V_{ref})(R_2/R_1)V_{in}$, and the gain of amplifier 108 ($A=V_{out}/V_{in}$) is thus proportional to the supply voltage $V_{CC}$. Gain accuracy is primarily determined by variation in the internal resistance ($R_1$) of reference OTA 202 and variation of reference voltage ($V_{ref}$) variation.

In another example, a constant voltage reference may be used instead of a $V_{CC}$-generated current I. With this configuration, amplifier 108 has a substantially constant gain value A across process, voltage, temperature (PVT) variations.

Figure 3:
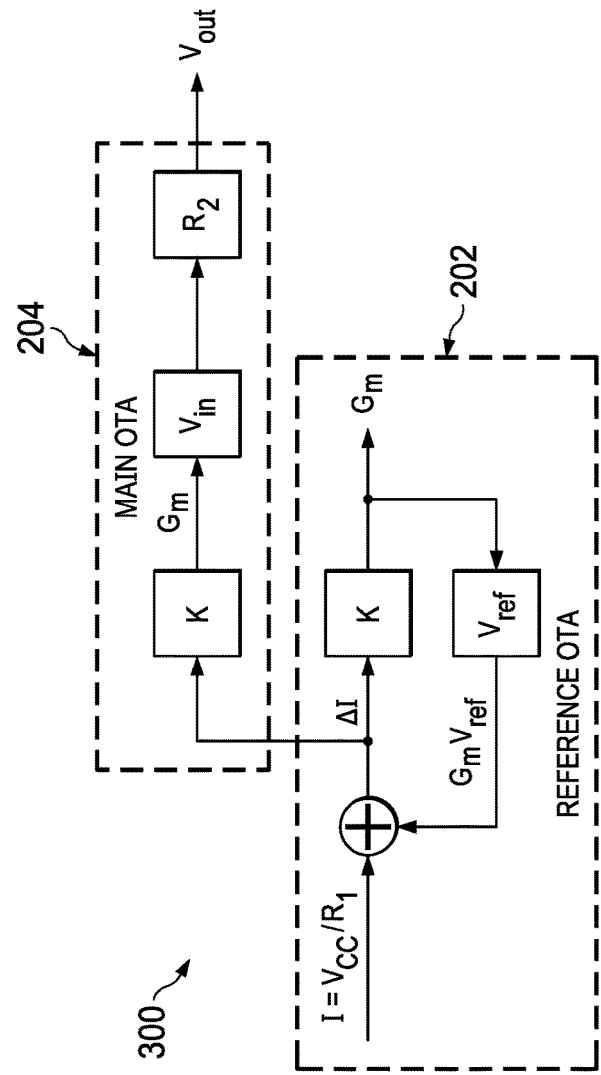
FIG. 3 is a diagram of an example feedback loop in operation of a ratiometric variable gain amplifier, such as that shown in FIG. 2.

FIG. 3 is a diagram of a feedback loop 300 in operation of a ratiometric variable gain amplifier, e.g., amplifier 108 configured as shown in FIG. 2. The current (I) generated by the supply voltage ($V_{CC}$) and the internal resistance ($R_1$) of reference OTA 202 is compared to the output current ($G_m*V_{ref}$) generated by the input of $V_{ref}$ to the reference signal input section of reference OTA 202 to yield a value ($\Delta I$) indicative of the difference between the two currents. In each of reference OTA 202 and main OTA 204, $\Delta I$ is transferred to the OTA's $G_m$ via a transfer function (K). The loop within reference OTA 202 is repeated to reduce $\Delta I$ to approximately zero to make the $G_m$ of both OTAs 202 and 204 approximately the same. With the OTAs having approximately the same $G_m$, $V_{in}$ is applied to the input signal input section of main OTA 204 to generate output currents used to generate $V_{out}$ via resistors 266 and 272, each having a resistance of $R_2$.

Figure 4:
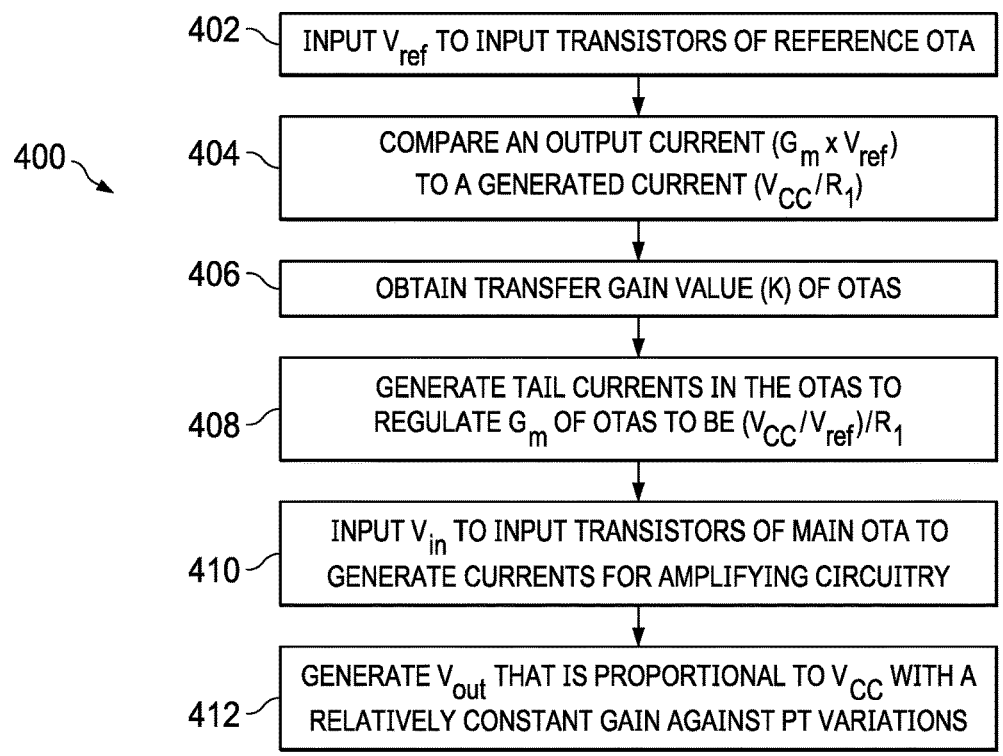
FIG. 4 is a flow diagram of an example method of operating a high tolerance ratiometric variable gain amplifier, such as that shown in FIG. 2.

FIG. 4 is a flow diagram of an example method 400 of operating a high tolerance ratiometric variable gain amplifier, e.g., amplifier 108 shown in FIG. 2.

In operation 402, a reference voltage ($V_{ref}$) is input to input transistors of a reference OTA. This generates an output current ($G_m*V_{ref}$), which, in operation 404, is compared with a current generated by a supply voltage ($V_{CC}$) applied to the reference OTA and its internal resistance ($R_1$). In operation 406, a transfer gain value (K) is obtained that transfers the difference between the two currents compared in operation 404 to the $G_m$'s of both the reference OTA and a main OTA coupled to the reference OTA. In operation 408, tail currents generated in the OTAs are used to regulate $G_m$ of the OTAs to be approximately the same, i.e., both approximately equal to ($V_{CC}/V_{ref}$) In operation 410, an input voltage ($V_{in}$) is input to input transistors of the main OTA to generate output currents for amplifying circuitry. An output voltage ($V_{out}$) is generated in operation 412 in which $V_{out}$ proportional to $V_{CC}$. In an example, $V_{out}=(V_{CC}/V_{ref})(R_1/R_2)V_{in}$. Also, the gain ($V_{out}/V_{in}$) remains relatively constant for a given $V_{CC}$ over a range of PT variations.

FIG. 4 depicts one possible set and order of operations. Not all operations need necessarily be performed in the order described. Some operations may be combined into a single operation. Additional operations and/or alternative operations may be performed.

Figure 5:
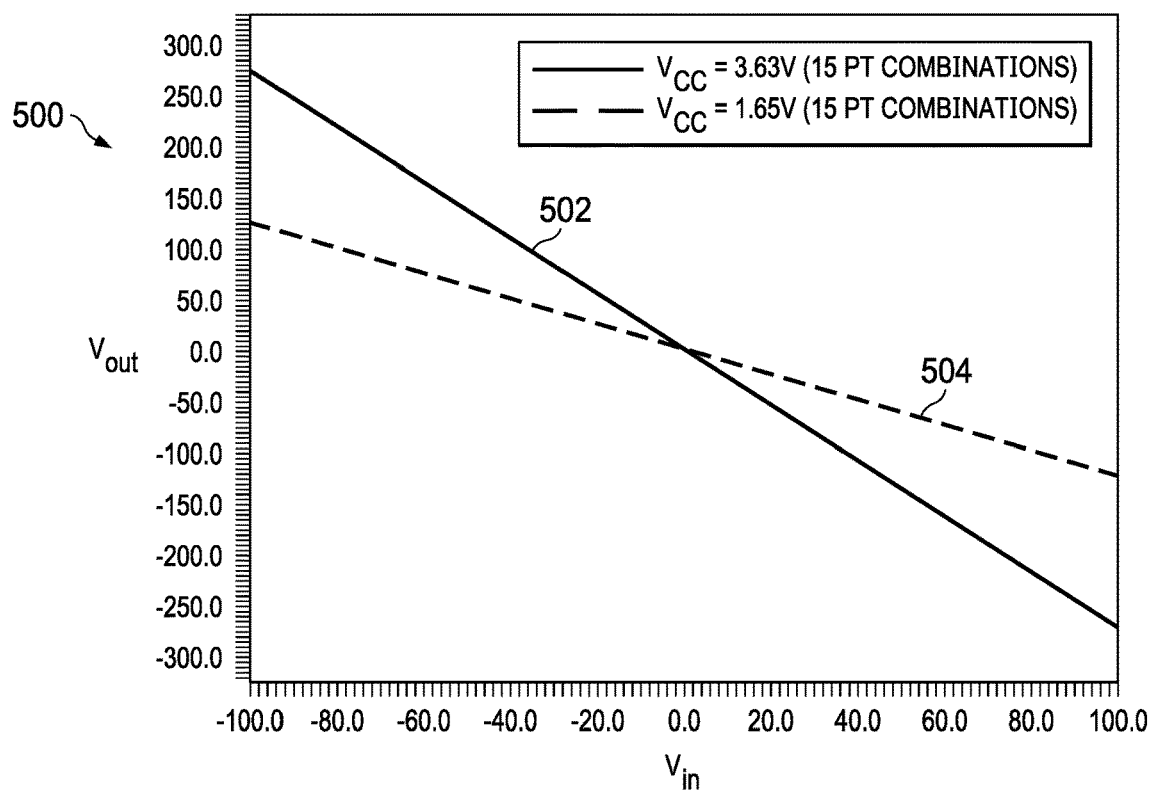
FIG. 5 shows example plots of the output voltage of ratiometric variable gain amplifier with respect to its input voltage for different supply voltages, each over a range of PT combinations.

FIG. 5 shows a graph 500 of $V_{out}$, i.e., the output voltage of ratiometric variable gain amplifier, with respect to its input voltage $V_{in}$. One plot 502 of graph 500 shows $V_{out}$ (mV) with respect to $V_{in}$ at a supply voltage $V_{CC}$ of 3.63 V, and another plot 504 of graph 500 shows $V_{out}$ with respect to yin (mV) at a $V_{CC}$ of 1.65 V. Each plot 502 and 504 is over a range of PT combinations, i.e., five process corners and three temperatures: −40° C., 25° C. and 150° C., giving 15 combinations. The gain ($A=V_{out}/V_{in}$) remained relatively constant (less than 1% variation) at each supply voltage across a range (15 combinations) of PT variations.

The term "couple" is used throughout the specification. The term and derivatives thereof may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (i.e. programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the term "terminal" means "node", "interconnection", "pin" and/or "lead". Unless specifically stated to the contrary, these terms generally mean an interconnection between or a terminus of a device element, a circuit element, an integrated circuit, a device or other electronic or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, etc.), and/or one or more sources (such as voltage and/or current sources) may instead include only the semiconductor elements within a single physical device (i.e. a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of MOSFETs is described herein, other types of transistors (or equivalent devices) may be used instead. For example, instead of using n- and p-type MOSFETs, n- and p-type bipolar junction transistors (BJTs) may be used instead or in addition to MOSFETs in the various circuits described. Circuits described herein are reconfigurable to include the replaced components to provide functionality at least partially similar to functionality available prior to the component replacement.

Uses of the phrase "ground" in the foregoing description includes a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications of the described examples are possible, as are other examples, within the scope of the claims. Moreover, features described herein may be applied in other environments and applications consistent with the teachings provided.

What is claimed is:

1. An amplifier comprising:
a first operational transconductance amplification (OTA) circuit including a reference signal input section configured to receive a reference voltage to generate an output current based on the reference voltage and a transconductance value of the first OTA circuit, the first OTA circuit further configured to generate a comparison current;
a second OTA circuit coupled to the first OTA circuit, the second OTA circuit including an input signal input section configured to receive an input voltage and an output at which an output signal is output, the second OTA circuit having substantially the same transconductance value as the first OTA circuit; and
amplifying circuitry comprising:
an input;
an output; and
a resistor having a first terminal and a second terminal;
wherein the input is coupled to the output of the second OTA, and the first terminal of the resistor is coupled to the input and the second terminal of the resistor is coupled to the output.

2. The amplifier of claim 1, wherein a feedback path is configured within the first and second OTAs to regulate the transconductance value of the first and second OTA circuits.

3. The amplifier of claim 1, wherein the transconductance value of the first and second OTA circuits is regulated to a value determined by a supply voltage applied to the first OTA circuit, the reference voltage and internal resistance of the first OTA circuit.

4. The amplifier of claim 1, wherein the output of the amplifying circuitry provides an output voltage that is proportional to a supply voltage applied to the first OTA circuit.

5. The amplifier of claim 4, wherein a gain of the amplifying circuitry is proportional to the supply voltage.

6. The amplifier of claim 1, wherein the comparison current is based on a supply voltage applied to the first OTA circuit and internal resistance of the first OTA circuit.

7. An amplifier comprising:
reference signal circuitry including:
first and second reference signal transistors, each having first and second current terminals and a control terminal, the control terminals of the first and second reference signal transistors configured to receive a differential reference voltage signal, and the first current terminals of the first and second input transistors coupled to define a first terminal and
a first tail current transistor having current terminals respectively coupled to the first terminal and a ground terminal,
the reference signal circuitry defining an output current path and a comparison current path;
input signal circuitry including:
first and second input signal transistors each having first and second current terminals and a control terminal, the control terminals of the first and second input signal transistors configured to receive a differential input voltage signal, and the first current terminals of the first and second input signal transistors coupled to define a second terminal, and
a second tail current transistor having current terminals respectively coupled to the second terminal and the ground terminal; and
amplifying circuitry including:
first and second current inputs respectively coupled to the second current terminals of the first and second input signal transistors,
first and second outputs at which a differential output voltage signal is output;
a first output resistor coupled between the first current input and the first output; and;
a second output resistor coupled between the second current input and the second output.

8. The amplifier of claim 7, wherein the reference signal circuitry includes a current source structure coupled to the second current terminals of the first and second reference signal transistors.

9. The amplifier of claim 7, wherein the first and second terminals, the first and second tail current transistors and the ground terminal form a tail current path.

10. The amplifier of claim 9, wherein the tail current path is configured to carry a tail current to regulate a transconductance value of the reference signal circuitry and the input signal circuitry.

11. The amplifier of claim 9, wherein the transconductance value is regulated to value determined by a supply voltage applied to the reference signal circuitry, a value of the differential reference voltage signal and internal resistance of the reference signal circuitry.

12. An amplifier comprising:
a first operational transconductance amplification (OTA) circuit configured to receive a reference voltage to generate an output current based on the reference voltage and a transconductance value of the first OTA circuit, the first OTA circuit further configured to generate a comparison current and a first tail current;
a second OTA circuit coupled to the first OTA circuit and configured to receive an input voltage and to generate a second tail current, the second OTA circuit having first and second current outputs; and
amplifying circuitry having first and second current inputs respectively coupled to the first and second current outputs of the second OTA circuit, and having first and second outputs at which a differential output voltage signal is output;
wherein the amplifying circuitry includes a first output resistor coupled between the first current input and the first output, and a second output resistor coupled between the second current input and the second output.

13. The amplifier of claim 12, wherein the first and second tail currents regulate the transconductance value of the second OTA circuit to be approximately the same as the transconductance value of the first OTA circuit.

14. An amplifier comprising:
a first operational transconductance amplification (OTA) circuit including a reference signal input section configured to receive a reference voltage to generate an output current based on the reference voltage and a transconductance value of the first OTA circuit, the first OTA circuit further configured to generate a constant voltage;

a second OTA circuit coupled to the first OTA circuit, the second OTA circuit including an input signal input section configured to receive an input voltage and an output at which an output signal is output, the second OTA circuit having substantially the same transconductance value as the first OTA circuit; and amplifying circuitry comprising:
  an input;
  an output; and
  a resistor having a first terminal and a second terminal;
    wherein the input is coupled to the output of the second OTA, and the first terminal of the resistor is coupled to the input and the second terminal of the resistor is coupled to the output.

15. The amplifier of claim 14, wherein a gain of the amplifying circuitry is substantially constant.

* * * * *